(12) United States Patent  (10) Patent No.: US 8,461,554 B1
Kurunczi et al.  (45) Date of Patent: Jun. 11, 2013

(54) APPARATUS AND METHOD FOR CHARGE NEUTRALIZATION DURING PROCESSING OF A WORKPIECE

(75) Inventors: Peter F. Kurunczi, Cambridge, MA (US); Christopher J. Leavitt, Gloucester, MA (US); Daniel Distaso, Merrimac, MA (US); Timothy J. Miller, Ipswich, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 12 days.

(21) Appl. No.: 13/313,078

(22) Filed: Dec. 7, 2011

(51) Int. Cl.
*H01J 3/14* (2006.01)

(52) U.S. Cl.
USPC ............ 250/492.21; 250/396 R; 250/398; 118/723 E; 118/723 R; 118/723 ER; 118/723 ME; 118/723 IR; 315/111.21; 315/123; 315/125

(58) Field of Classification Search
USPC .............. 250/281, 282, 492.21, 492.1, 492.2, 250/492.3, 396 R, 398, 423 R, 424; 118/723 E, 118/723 R, 723 ER, 723 ME, 723 IR; 315/111.21, 111.71, 111.81, 111.91, 119, 315/121, 122, 123, 125, 128, 182
See application file for complete search history.

(56) References Cited

U.S. PATENT DOCUMENTS

| | | | |
|---|---|---|---|
| 6,237,527 B1 | 5/2001 | Kellerman et al. | |
| 6,528,804 B1 * | 3/2003 | Sullivan et al. | 250/492.21 |
| 7,767,986 B2 * | 8/2010 | Dorai et al. | 250/492.21 |
| 2009/0004836 A1 * | 1/2009 | Singh et al. | 438/513 |
| 2011/0143527 A1 * | 6/2011 | Platow et al. | 438/515 |
| 2012/0228515 A1 * | 9/2012 | Leavitt et al. | 250/396 R |

* cited by examiner

*Primary Examiner* — Bernard E Souw

(57) ABSTRACT

A processing system may include a plasma source for providing a plasma and a workpiece holder arranged to receive ions from the plasma. The processing system may further include a pulsed bias circuit electrically coupled to the plasma source and operable to switch a bias voltage supplied to the plasma source between a high voltage state in which the plasma source is biased positively with respect to ground and a low voltage state in which the plasma source is biased negatively with respect to the ground.

19 Claims, 7 Drawing Sheets

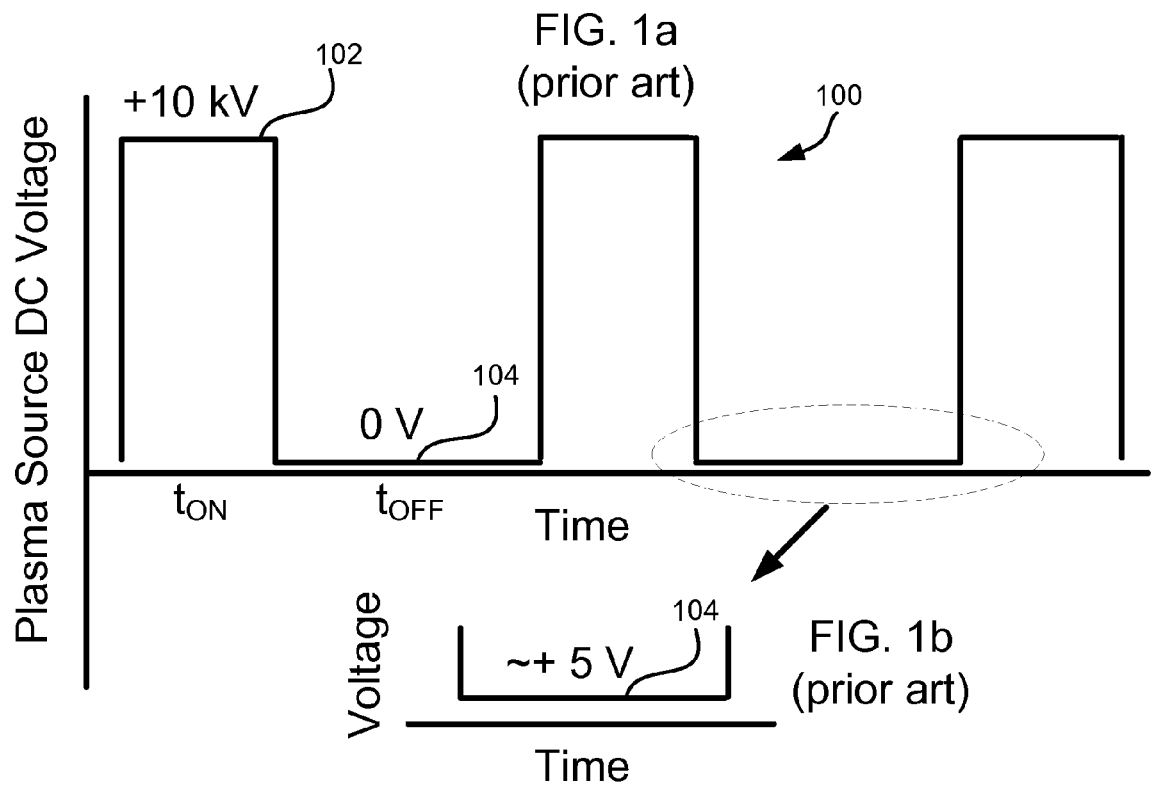
FIG. 1a (prior art)
FIG. 1b (prior art)
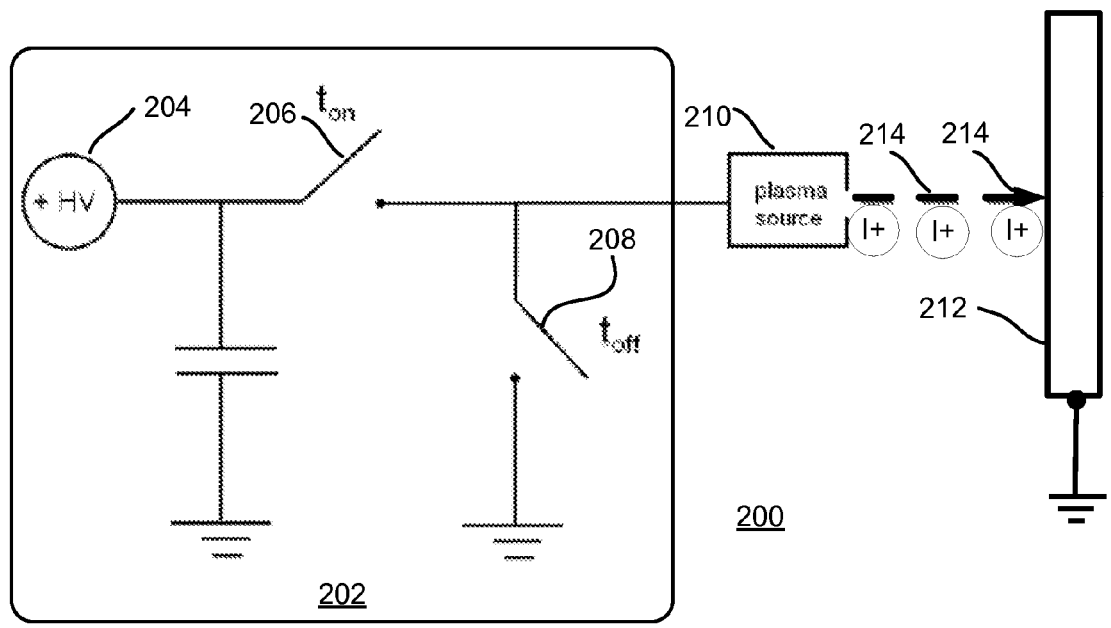
FIG. 2 (prior art)

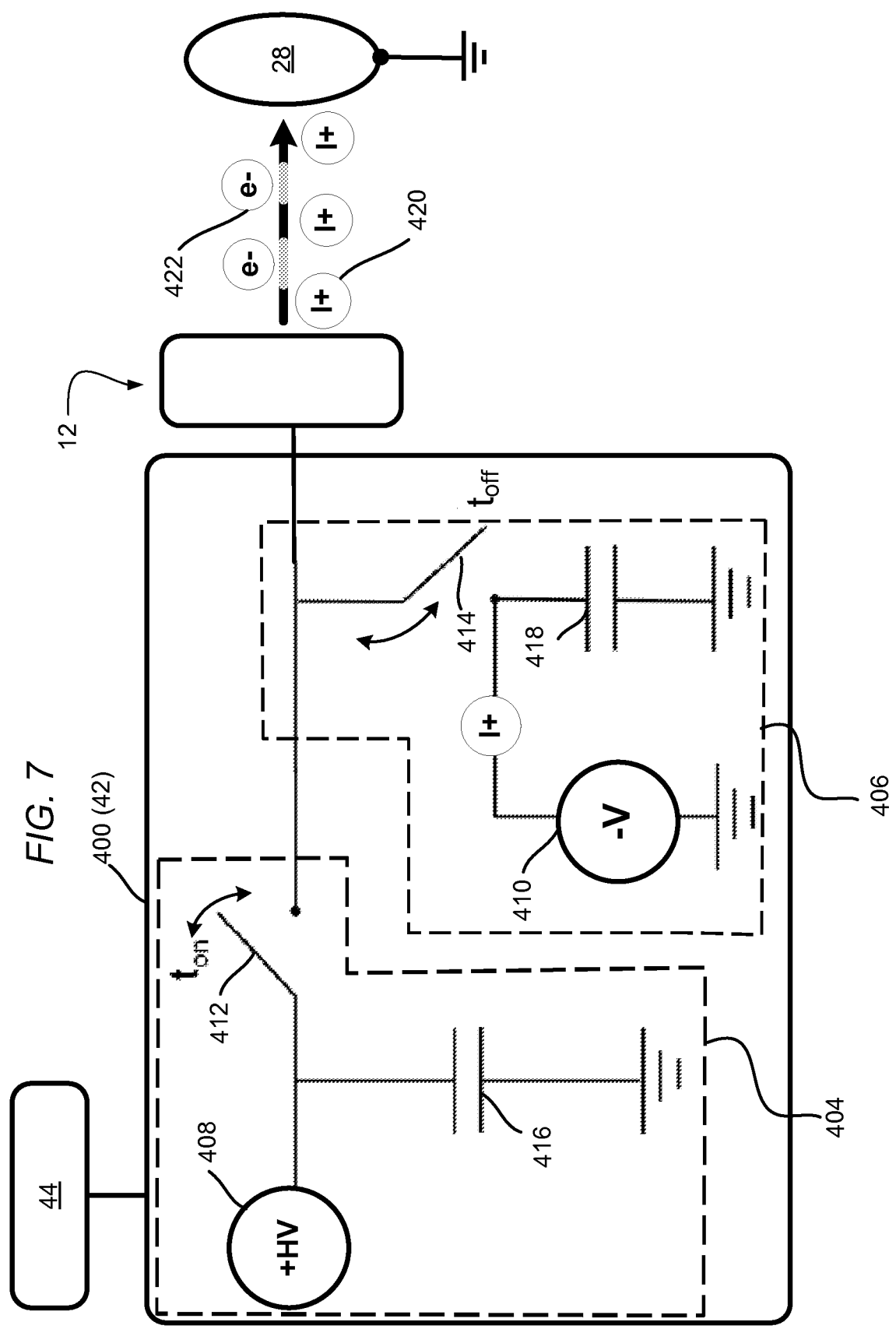

APPARATUS AND METHOD FOR CHARGE NEUTRALIZATION DURING PROCESSING OF A WORKPIECE

FIELD

This invention relates to ion treatment of workpieces and, more particularly, to a method and apparatus for charge neutralization during ion treatment of workpiece.

BACKGROUND

Ion beam and plasma processing of workpieces (substrates) may be performed for a variety of purposes including for ion implantation, surface texturing, and etching of a surface. Ion implantation in particular is a standard technique for introducing property-altering impurities into substrates. A desired impurity material is ionized in an plasma source, the ions are accelerated to form an ion beam of prescribed energy, and the ion beam is directed at the surface of the substrate. The energetic ions in the beam penetrate into the sub-surface of the substrate material and are embedded into the crystalline lattice of the substrate material to form a region of desired conductivity or material property.

One challenge for ion beam processing is the need to dissipate charge at a workpiece, which may occur during ion implantation of a workpiece because ions impinging on a substrate by nature carry charge. In the case of ion beams that comprise positive ions, positive charge may build up on the workpiece after exposure to an ion beam. In order for this charge to be dissipated, the workpiece holder may be grounded, thereby providing a conductive path for conducting the charge from the workpiece surface. However, if a workpiece itself is a poor conductor or an electrical insulator, the charge on the workpiece surface may have no conductive path to ground, thereby preventing the charge from being dissipated.

Neutralization of charge that builds up on a workpiece surface due to exposure to an ion beam may also be accomplished by providing charged species of opposite polarity to the charge on the workpiece. In typical known ion implantation systems that employ pulsed ion implantation using positive ions, including plasma immersion ion implantation, a plasma may be established proximate a workpiece holder and a periodic bias may be applied in pulses between the plasma and workpiece holder. During "on" periods positive ions may be attracted to the workpiece by providing a bias between the plasma and workpiece holder, wherein the potential at the workpiece holder is negative with respect to the plasma. At the same time, electrons in the plasma may be repelled from the workpiece holder due to its relatively negative potential with respect to the plasma. During "off" periods when the implantation system no longer sets the workpiece holder at a negative potential with respect to the plasma, electrons may drift towards the workpiece. However, the flux of electrons during these "off" periods may be insufficient to neutralize the surface of the workpiece and excessive positive charge may remain.

FIG. 1a illustrates a voltage pulse train 100 that includes a series of "on" periods 102 interrupted by "off" periods 104. During the "on" periods 102 a positive high voltage may be applied to a plasma source, while the workpiece is grounded, thereby setting the workpiece at a high negative potential (voltage) with respect to the plasma. Accordingly, positive ions may be attracted to the workpiece at a high energy of about 10 kV in the example shown in FIG. 1a. During the "off" periods 104, when the DC voltage of the plasma source is nominally at ground potential, in principle the voltage between plasma and workpiece is about zero. Accordingly some electrons may drift out of a plasma and towards a workpiece during the "off" periods 104, thereby tending to neutralize the workpiece.

FIG. 2 provides an illustration of circuitry 202 that may be used to create the voltage pulse train 100. As depicted in FIG. 2, a plasma source 210 is coupled to the circuitry 202 to provide pulsed ion beams 214 to workpiece holder 212. The circuitry 202 includes a high voltage power supply 204, and a high voltage switch 206 that can connect or disconnect the high voltage power supply 204 to the plasma source 210. When a plasma is created in the plasma source 210, the plasma source 210 may be biased to a high positive potential, such as +10 kV illustrated in FIG. 1a, by closing high voltage switch 206. This high positive potential serves to extract positive ions 214 from plasma source 210 and accelerate the positive ions 214 toward workpiece holder. When high voltage switch 206 is open and second switch 208 is closed, the plasma source is grounded and positive ions are no longer attracted toward workpiece holder 212. Accordingly, by alternating between configurations in which one switch of switches 206, 208 is open, and the other closed, pulsed ion beams 214 may be created during "on" periods 202.

While the circuitry 202 may produce a waveform generally as shown by voltage pulse train, an actual voltage waveform may differ from a desired waveform where the voltage is zero during "off" periods. For example, the high voltage switch 206 and second switch 208 may have an internal impedance that results in a small voltage drop. Thus, during the "off" periods 104 in which the plasma source is connected through second switch 208 to ground, the small internal impedance of second switch 208 may result in plasma source 210 not being directly grounded, but rather floating at a potential that may be several volts above zero. As illustrated in FIG. 1b, which shows a more expanded view of one "off" period 104, the plasma source may actually acquire a potential up to several volts positive due to the internal impedance. During the "off" periods 104, the resulting positive bias of plasma source 210 with respect to workpiece holder 212 impedes the flow of electrons to workpiece holder 212, since the workpiece holder potential is several volts more negative than the plasma source potential. Thus, during these "off" periods the flux of electrons from the plasma with sufficient initial energy to overcome the negative potential of the workpiece may be insufficient to neutralize the surface of the workpiece, such that excessive positive charge may remain.

In view of the above, it will be appreciated that it may be useful to provide improvements for neutralization of charge in systems that provide charged species of a predominant polarity, such as ion beam systems.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a plasma processing system includes a plasma source for providing a plasma, a workpiece holder arranged to receive ions from the plasma, and a pulsed bias circuit operable to switch a bias voltage supplied between the plasma source and workpiece holder, between a high voltage state in which the plasma source is biased positively with respect to the workpiece and a low voltage state in which the plasma source is biased negatively with respect to the workpiece.

In another embodiment, a method of treating a workpiece in a processing system, comprises igniting a plasma using a plasma source, providing a workpiece to receive ions from the plasma source, and applying a voltage pulse train to the plasma source, the voltage pulse train comprising a high voltage state in which the plasma source is biased positively with respect to the workpiece and a low voltage state in which the plasma source is biased negatively with respect to the workpiece.

BRIEF DESCRIPTION OF THE DRAWINGS

For a better understanding of the present disclosure, reference is made to the accompanying drawings, which are incorporated herein by reference and in which:

FIG. 1a illustrates a conventional voltage pulse train;

FIG. 1b shows an expanded view of the voltage pulse train of FIG. 1a;

FIG. 2 provides an illustration of circuitry that may be used to create the voltage pulse train of FIGS. 1a, 1b;

FIG. 7 provides a composite illustration of multiple modes of operation of an exemplary pulsed bias circuit;

DETAILED DESCRIPTION

Embodiments of a system and method are described herein in connection with ion processing of workpieces (substrates). In various embodiments, this system can be used with, for example, semiconductor substrates, bit-patterned media, solid-state batteries, or flat panels, or other substrates. Thus, the invention is not limited to the specific embodiments described below.

In various embodiments, a processing system includes a plasma source and switch circuitry for providing pulsed biasing of the plasma source with respect to a workpiece holder. The switch circuitry may provide a pulsed biasing that provides alternating pulses of ion beams and electrons to a workpiece (holder) in various embodiments. By providing a novel pulsed biasing circuit arrangement, a workpiece exposed to ions by pulsed ion processing of positive ions can be effectively neutralized by electrons supplied during off periods of the pulsed implantation process. In the discussion to follow, reference in the text and FIGs. may be made to a workpiece holder without explicit reference to a workpiece. However, it is to be understood that, unless otherwise indicated, it is implicit that a workpiece may be present in scenarios or arrangements that merely depict or describe a workpiece holder.

In various embodiments, plasma based ion implantation systems may employ plasma source to generate a plasma and separate circuitry to control biasing between the plasma and workpiece. In addition to use in plasma immersion ion implantation systems, the present embodiments may be employed in processing systems that situate an extraction plate between plasma and workpiece in order to provide a controllable ion beam having a unique set of properties.

Figure 3:
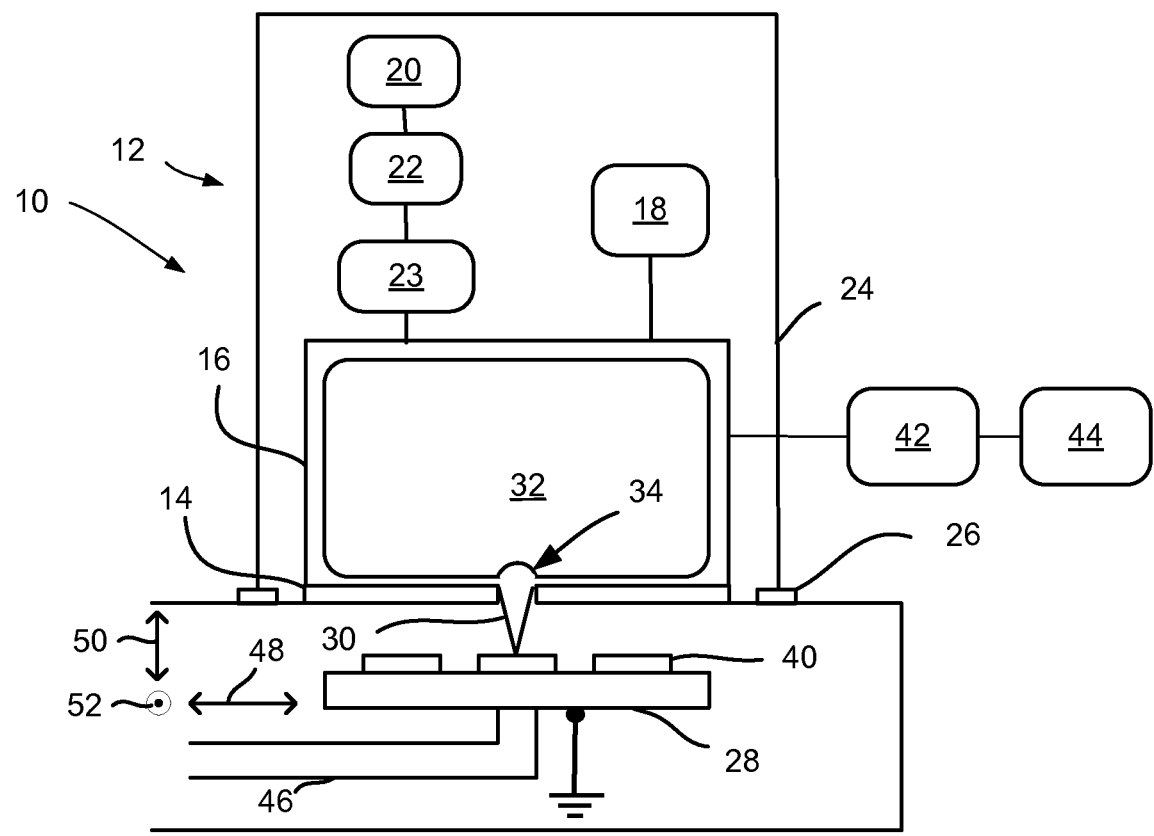
FIG. 3 is a block diagram that depicts a processing system consistent with present embodiments.

FIG. 3 is a block diagram that depicts a processing system that provides ions at multiple angles to a workpiece. The processing system 10 includes a plasma source 12, an extraction plate 14 (or sheath engineering plate), and a process chamber 16. A gas source 18 is connected to the plasma chamber 16. The plasma source 12 or other components of the processing system 10 also may be connected to a pump (not shown), such as a turbo pump. In various embodiments, the plasma source 12 may be an RF plasma source, inductively-coupled plasma (ICP) source, indirectly heated cathode (IHC), helicon, glow discharge source, or other plasma sources known to those skilled in the art. However, in the example shown in FIG. 3, the plasma source 12 may be an RF plasma source that includes an RF generator 20, an RF matching network 22, and antenna 23. The plasma source 12 is surrounded by an enclosure 24 and an insulator 26 separates the enclosure 24 from the plasma chamber 16. As illustrated, the workpiece holder 28 may be grounded.

The extraction plate 14 is used to extract ions 30 for implantation into a workpiece (substrate) 40, which may be grounded, as illustrated. The extraction plate 14 may be cooled. The plasma source 12 may be biased and a bias circuit as described below may be provided to provide a continuous or pulsed bias to the plasma source 12 to attract the ions 30. The extraction plate 14 may have at least one aperture 34, through which ions 30 are provided to the workpiece 40.

An ion beam extracted from a plasma using processing system 10 may be used to simultaneously provide to workpieces 40 ions 30 over a range of angles if desired without requiring complicated masking or lithography procedures. This ability to create a wide angular distribution of ions facilitates processing of workpieces having three dimensional features where it may be desirable to simultaneously provide ions incident on the features from different directions. Moreover, the exact angular distribution of ions 30 that are provided to workpiece 40 may be established according to a specific set of ion beam optics conditions (parameters) in processing system 10. Parameters that may affect the angular distribution of ions 30 include the shape and size of aperture 34, the implantation voltage, spacing between extraction plate 14 and workpiece 40, and plasma density. Thus, a specific set of parameters may establish a specific ion angular distribution of ions 30.

Processing system 10 also includes a pulsed bias circuit 42 that may provide pulses of voltage to created pulses of charged particles directed to workpiece(s) 40, as detailed below. Consistent with the present embodiments, the pulsed bias circuit 42 may produce a voltage waveform that provides a pulsed ion beam to workpiece during "on" periods of a pulse, as well as electrons that serve to neutralize workpiece 40 during "off" periods of the pulse. Also illustrated in FIG. 3 is a controller 44 that may set control signals to control operation of the pulsed bias circuit 42, as described below. In some embodiments, a mechanism 46, such as a movable stage, may be provided to move workpiece holder 28 along one or more mutually orthogonal directions 48, 50, 52. For example the position of workpiece holder 28 may be changed along the direction 50 to adjust the separation between extraction plate 14 and workpiece holder 28. The workpiece holder 28 may also be scanned along direction 48 and/or direction 52 while exposed to ions 30 to provide coverage over desired regions of workpiece(s) 40.

Figure 4:
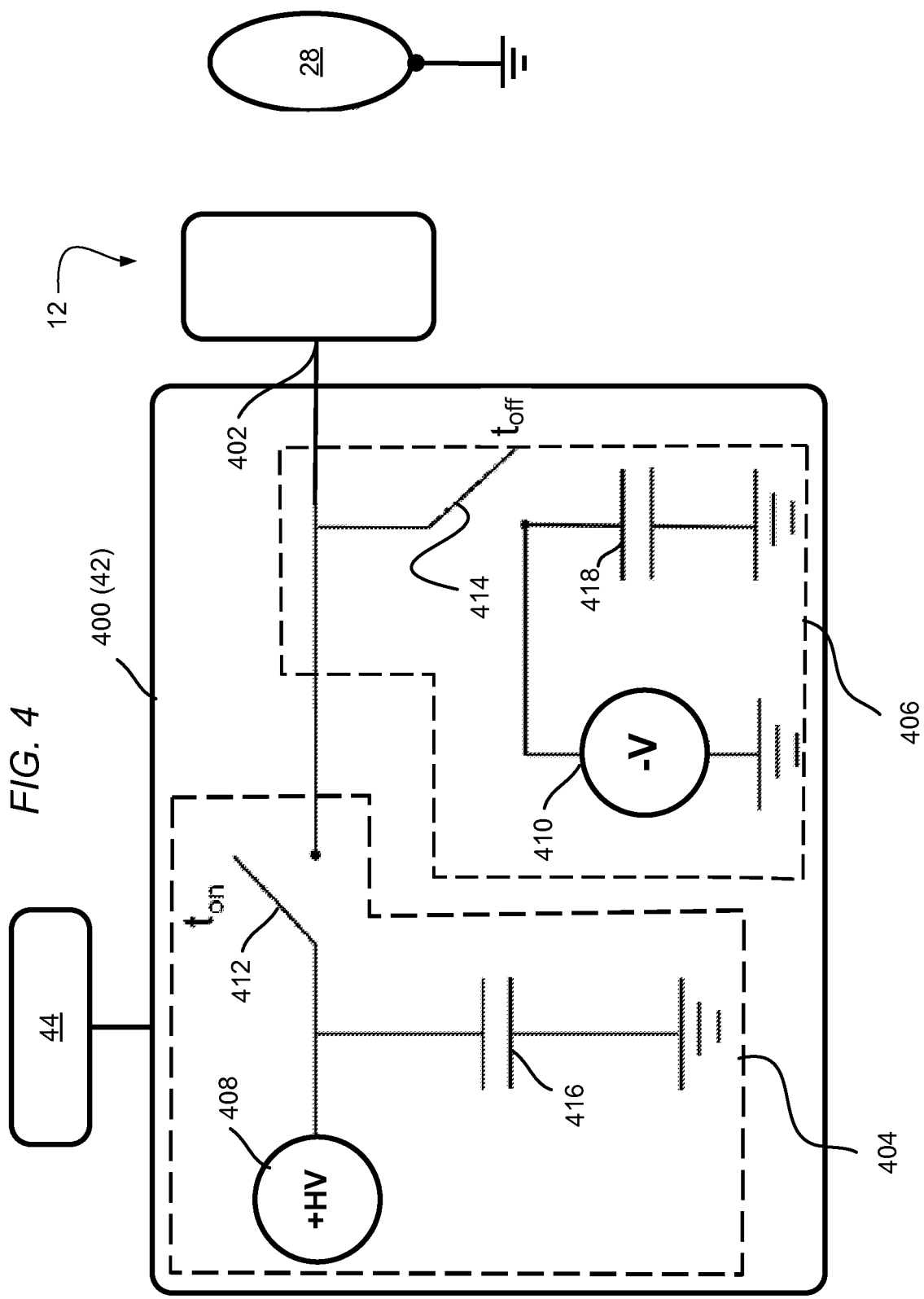
FIG. 4 depicts one embodiment of a pulsed bias circuit.

FIG. 4 depicts one embodiment 400 of the pulsed bias circuit 42 generally depicted at FIG. 3. The pulsed bias circuit 400 may be coupled to the controller 44 as illustrated to receive control signals that direct operation of the pulsed bias circuit 400. An output 402 of pulsed bias circuit 400 is coupled to the plasma source 12 to control voltage applied between plasma source 12 and workpiece holder 28. As depicted in FIG. 4, the workpiece holder 28 may be connected to ground so that a voltage difference between the workpiece holder 28 and plasma source 12 is equivalent to the voltage set by pulsed bias circuit 400.

Included in pulsed bias circuit 400 is a high voltage circuit 404 and low voltage circuit 406. The high voltage circuit 404 may include, for example, a high voltage power supply 408, high voltage switch 412, and capacitor 416 and the low voltage circuit 406 may include a low voltage supply 410, low voltage switch 414, and capacitor 418.

Consistent with the present embodiments, the high voltage circuit 404 may set the voltage of plasma source 12 to be at a high positive potential with respect to workpiece holder 28. As illustrated, the high voltage circuit 404 includes a high voltage (HV) power supply 408, which may output a positive voltage of about 100 V or more, and in particular may output a positive voltage of 500 V to 50 kV. Accordingly, when the high voltage supply 408 is connected to plasma source 12, via high voltage switch 412, the plasma source 12 may attain a potential of about +100V to +50 kV, causing positive ions extracted from plasma source 12 to be accelerated towards workpiece holder 28 at energies ranging from 100 eV to 50 keV for singly charged ions. As detailed below, the high voltage circuit may 404 may operate to intermittently electrically connect and disconnect the high voltage supply 408 from plasma source 12, thereby pulsing the plasma source 12 intermittently at high voltage, which may drive pulses of ions toward the workpiece holder 28.

Consistent with the present embodiments, the low voltage circuit 406 may set the voltage of plasma source 12 at a small negative potential with respect to workpiece holder 28. As illustrated, the low voltage circuit 406 includes a low voltage supply 410, which may output a negative voltage of about −2 V or more, and in particular may output a negative voltage of −2 V to −100 V. Accordingly, when the low voltage supply 410 is connected to plasma source 12, via low voltage switch 414, the plasma source may attain a potential of about −2 V to −100 V, preventing ions in plasma source 12 from accelerating towards workpiece holder 28, while at the same time accelerating electrons in plasma source 12 toward the workpiece holder 28 at low energies, that is, energies less than or equal to about 100 eV. As detailed below, the low voltage circuit 406 may operate to intermittently electrically connect and disconnect the low voltage supply 410 from plasma source 12, thereby pulsing the plasma source 12 intermittently at a small negative voltage, which may drive electrons (not shown) in pulses toward the workpiece holder 28.

Figure 5:
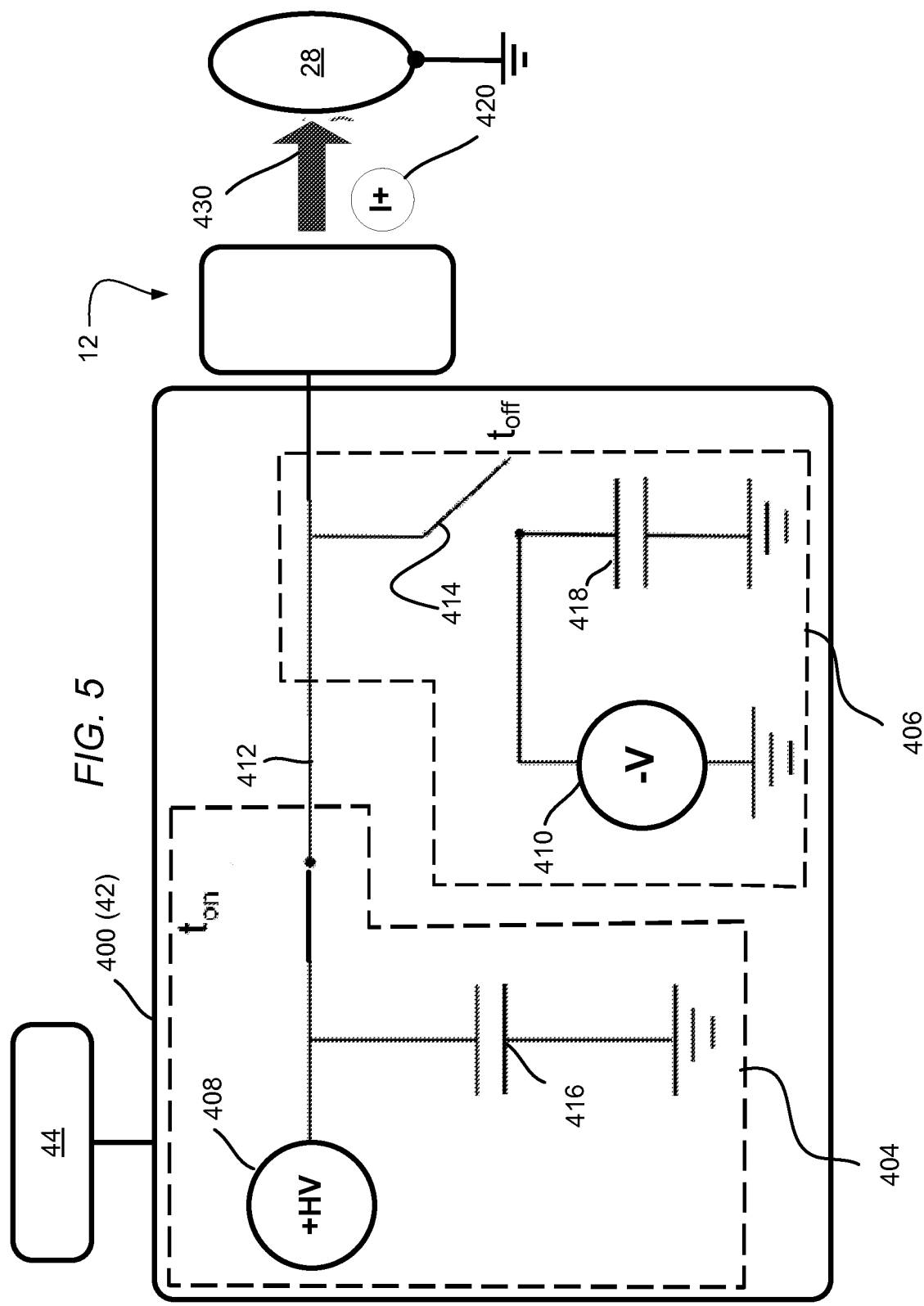
FIG. 5 depicts one mode of operation of an exemplary pulsed bias circuit.

Referring now to FIG. 5, there is shown one mode of operation of pulsed bias circuit 400 that directs positive ions toward workpiece holder 28. In the scenario depicted in FIG. 5, the high voltage switch 412 is closed, thereby coupling the high voltage supply 408 to plasma source 12. In the operation mode depicted in FIG. 5, the low voltage switch 414 is open, thereby decoupling the low voltage supply 410 from the plasma source 12. In this scenario, plasma source 12 may charge up to a positive potential (voltage) supplied by high voltage supply 408. Accordingly, ions 420 may be accelerated towards workpiece holder 28. In various embodiments of a plasma source 12, the ions 420 may form a beam, such as beam 430, which includes ions directed to the workpiece holder 28 over a range of angles. In accordance with various embodiments, the controller 44 may direct the high voltage switch 412 to open and close periodically in order to provide ions 420 as pulses of ions to workpiece holder 28.

Figure 6:
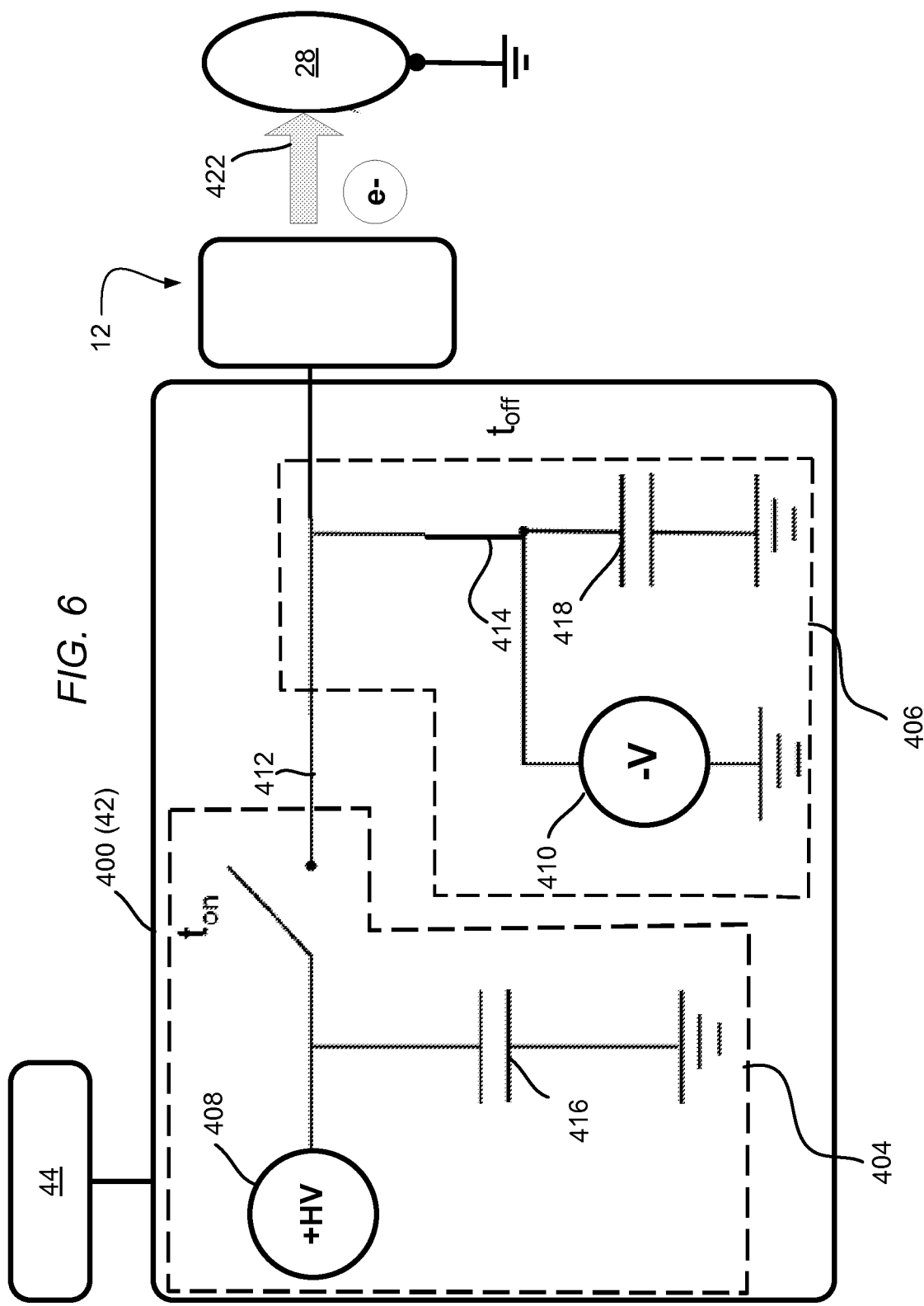
FIG. 6 specifically depicts another mode of operation of an exemplary pulsed bias circuit.

In order to prevent excessive positive charge from building up on workpiece holder 28, the pulsed bias circuit 400 may be intermittently switched to a second mode of operation, as illustrated in FIG. 6. FIG. 6 depicts a scenario in which the high voltage switch is open, thereby disconnecting the high voltage supply 408 from the plasma source 12. In addition, the low voltage switch 414 is closed, which connects the low voltage supply 410 to the plasma source 12, and thus may provide a small negative bias to the plasma source 12 as discussed above. In this scenario, the plasma source may attain a negative voltage set by the low voltage supply 410, causing electrons 422 to accelerate from the plasma source 12 and impinge upon workpiece holder 28, which may be grounded as shown.

In various embodiments, the controller 44 may direct the pulsed bias circuit 400 to alternate between the configurations depicted in FIGS. 5 and 6 so that a series of pulses of positive voltage (>100 V) are applied to plasma source 12, which are interspersed with a series of pulses of negative voltage (−100 V to about −12V). Thus, the pulsed bias circuit may alternately close high voltage switch 412 while simultaneously opening low voltage switch 414, and open high voltage switch 412 while closing low voltage switch 414. This may produce a series of pulses of ions 420 that are interspersed with pulses of electrons 422, both species being accelerated from the plasma source and incident on the workpiece holder, as illustrated in FIG. 7.

FIG. 7 provides an illustration of processing of a workpiece (not explicitly shown) by alternating pulses of ions 420 and electrons 422. As noted, the ions 420 may be accelerated when high voltage switch 412 is closed (and low voltage switch 414 open), while the electrons 422 may be accelerated while the high voltage switch 412 is open (and low voltage switch 414 closed). Thus, although multiple pulses of ions 420 and electrons 422 are depicted in the view of FIG. 7, it will be readily appreciated that at any given instant only a pulse of ions 420 or electrons 422 may be incident upon the workpiece holder 28.

By alternating pulses of ions 420 and electrons 422, a processing system, such as processing system 10, operating in conjunction with the pulsed bias circuit 400, may effectively process a workpiece (see workpieces 40 in FIG. 3) located on workpiece holder 28 with a dose of ions 420 while preventing excessive positive charge buildup. In various embodiments the duration of the pulses of electrons 422 and/or ions 420 may be on the order of a few milliseconds or less, and in particular may be on the order of about 1 μs to 10 ms. Depending upon one or more factors, including the dose of positive charge placed upon the workpiece holder 28 by ions 420, the negative voltage set by low voltage supply 410, and the duration in which the low voltage switch 414 remains closed, the pulse of electrons 422 may neutralize some or all of any positive charge on the workpiece holder between each dose of ions 420, as discussed further below with respect to FIG. 8.

In order to ensure effective switching back and forth between "on" states in which the high voltage switch 412 is closed, and "off" states in which the high voltage switch 412 is open, the pulsed bias circuit also includes a high voltage circuit capacitor 416 and low voltage circuit capacitor 418. The high voltage circuit capacitor 416 may store charge that can be discharged in a rapid pulse into plasma source 12 when high voltage switch 412 is closed. In this manner, the voltage may build up rapidly in plasma source 12, facilitating the ability of the high voltage supply 408 to rapidly bring the plasma source to the actual voltage set by the high voltage supply 408. This may be especially useful in processing systems in which the components of plasma source 12 are relatively massive and require substantial charge to adjust the potential to the desired voltage.

On the other hand, the low voltage circuit capacitor 418 may facilitate discharge of the plasma source 12 when the low voltage switch 414 is closed and the high voltage switch is open. Because a relatively large charge may be present on components of plasma source 12 during an "on" period, in order to effectively establish in a timely manner the negative voltage set by low voltage supply 410, it may be advantageous to quickly discharge plasma source 12 components.

The actual voltage attained by plasma source 12 during the "off" periods may differ from the voltage set by low voltage supply 410. Thus, due to internal circuit impedance, the plasma source 12 may remain at a potential that is slightly positive with respect to the nominal voltage, as discussed above. Accordingly, the present embodiments may adjust for this by setting the low voltage supply 410 to a greater negative voltage than actually desired for plasma source 12. For example, if it is desired to provide electrons with an energy of about 5 eV when incident on a workpiece 40, the low voltage supply 410 may be set at −10 V to account for a +5 V offset that may exist between the set voltage and voltage attained on plasma source 12. In this manner the potential of the plasma source 12 may actually reach about −5V, thereby accelerating negatively charged electrons through a field of 5 V between the plasma source 12 and ground potential at the workpiece holder 28.

Figure 8A:
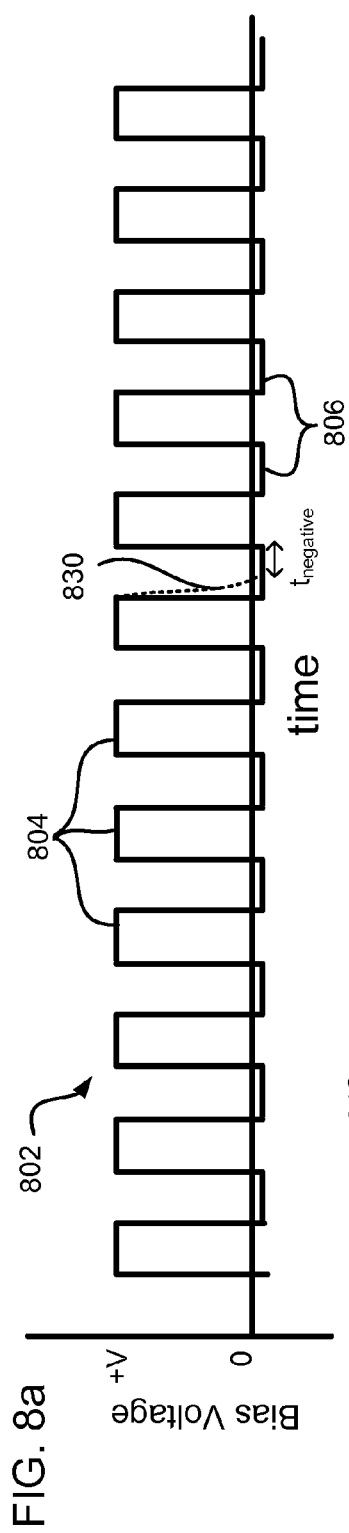
FIG. 8a depicts one embodiment of a voltage pulse train.

In various embodiments, the pulse bias circuit 400 may adjust "on" periods, "off" periods, and the negative voltage set during "off" periods, among other factors, to optimize processing of a workpiece. For example, a workpiece may be processed using a first voltage pulse train that includes components such as a first "on" period, first "off" period, and first negative voltage, after which the accumulated charge at the workpiece may be monitored. Any of the aforementioned components of the voltage pulse train may be adjusted based upon the monitored accumulated charge. FIG. 8a depicts one embodiment of a voltage pulse train 802 that may be output by a pulsed bias circuit, such as pulsed bias circuit 400. The voltage pulse train 802 includes "on" portions 804 in which a positive bias is output, which may correspond to a positive bias applied to a plasma source. The "on" portions 804 are interspersed by "off" portions 806, in which a small negative bias voltage is output. In this example, the duty cycle of "on" portions 806 may be 50%, meaning that the "on" portions and "off" portions 806 are of equal duration. As noted above, the pulsed bias circuit 400 may include capacitors that facilitate charging and discharging of a plasma source 12, so that the voltage pulse train 802 may roughly, though not necessarily identically, correspond to the actual voltage variation on plasma source 12. Thus, the voltage at plasma source 12 may constitute a series of square wave pulses whose tops correspond to a high positive voltage, and whose troughs correspond to a small negative voltage. When subject to a 50% duty cycle, a workpiece may accordingly be exposed to ion processing for one half of the total processing time, and may be exposed to electrons during one half of the total processing time. Although it may be desirable to increase the duty cycle in order to complete a desired ion treatment more rapidly, increasing the percentage of time that a workpiece is exposed to ions may result in excessive positive charge building up on the workpiece. Accordingly, under some processing conditions, the positive charge developed during "on" portions 804 may be incompletely neutralized during "off" portions 806.

In order to address this situation, the negative voltage applied during "off" portions 806 may be increased to attract a higher flux of electrons from a plasma source, thereby providing a faster neutralization of positive charge on a workpiece. However, this should be balanced with possible damage the increased electron energy may cause if the workpiece is a semiconductor substrate for building electronic devices.

Figure 8B:
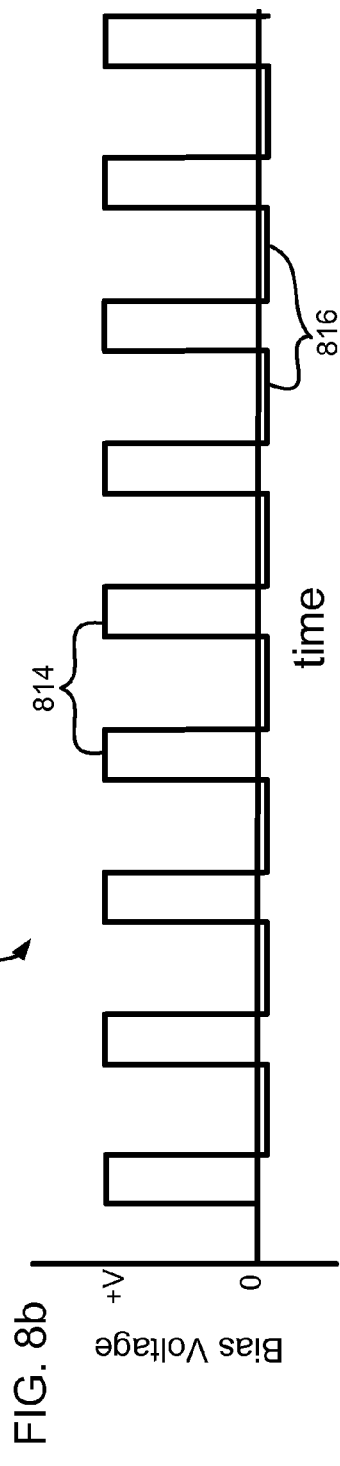
FIG. 8b depicts another embodiment of a voltage pulse train.

FIG. 8b illustrates another way of increasing the neutralization of a workpiece. In the embodiment of FIG. 8b, a voltage pulse train 812 comprises a series of "on" portions 814 interspersed by "off" portions 816 whose duration is longer than that of "on" portions 814. Thus, the high voltage pulse duty cycle is lower than in the scenario of FIG. 8a, thereby affording relatively more time for electrons to neutralize positive charge on a workpiece during the "off" portions 816, without having to increase electron energy.

Figure 8C:
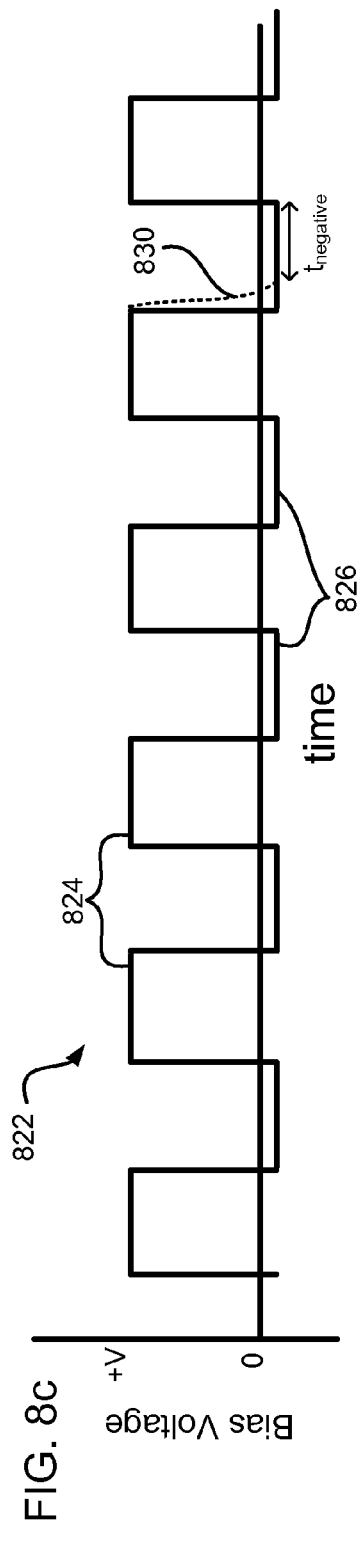
FIG. 8c depicts a further embodiment of a voltage pulse train.

FIG. 8c depicts another embodiment in which the voltage pulse train 822 may comprise the same duty cycle (50%) as in FIG. 8a thereby providing the same workpiece throughput as in FIG. 8a by maintaining the same proportion of ion processing time to total processing time. However, the duration of "on" portions 824 and "off" portions 826 is longer than in the corresponding portions of voltage pulse train 802 because the frequency of the voltage pulse train 822 is lower than the frequency of the other voltage pulse train 802. The longer "off" portions 826, in particular, may be more effective in neutralizing positive charge than the "off" portions 806, even though the proportion of time of the "off" portions 806 and 826 is the same. This may result from the fact that a decay time, shown by a voltage decay curve 830, which may be on the order of hundreds to thousands of nanoseconds, is needed for the plasma source to attain a desired negative potential after switching from a high positive voltage. This therefore shortens the actual time $t_{negative}$ where the plasma source is at the desired negative potential and electrons are accelerated toward a workpiece during "off" portions 826, as shown in FIG. 8a. In the case of FIG. 8c, $t_{negative}$ may occupy a greater proportion of the "off" portion 826 as compared to the proportion of the desired "off" portion 806, where voltage decay curve 830 consumes a larger fraction of the total "off" portion 806.

However, if the duration of the "off" portion in which a negative voltage is applied to the plasma source is sufficiently long, a workpiece 40 may develop a negative charge due to excessive exposure to electrons, after which electrons may no longer by accelerated from the plasma source. Thus, depending on various other operating parameters, including plasma power, gas pressure and plasma source voltage, an optimum range for the duration of "off" portion of a voltage pulse train may be defined.

The methods described herein may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or writeable CD, flash memory chips (e.g., thumb drives), various magnetic storage media, and the like.

In particular, steps for providing voltage pulse trains to a plasma source may be performed at least partially by a combination of an electronic processor, computer readable memory, and/or computer readable program. The computer memory may be further configured to receive, display and store process history information associated with operation of a plasma system and as exemplified by the stored voltage values.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A processing system, comprising:
   a plasma source for providing a plasma,
   a workpiece holder arranged to receive ions from the plasma; and
   a pulsed bias circuit electrically coupled to the plasma source, the pulsed bias circuit operable to switch a bias voltage supplied to the plasma source between a high voltage state in which the plasma source is biased positively with respect to ground and a low voltage state in which the plasma source is biased negatively with respect to the ground.

2. The processing system of claim 1, further comprising an extraction plate disposed between the plasma source and the workpiece holder, the extraction plate arranged to define an ion beam during the high voltage state.

3. The processing system of claim 1, wherein the pulsed bias circuit comprises a high voltage circuit that includes a capacitor for discharging current into the plasma source when the bias voltage is switched to the high voltage state.

4. The processing system of claim 3, the high voltage circuit comprising a high voltage power supply to supply a positive voltage and high voltage switch operable to alternately connect and disconnect the high voltage power supply to the plasma source.

5. The processing system of claim 4, comprising a low voltage circuit that includes:
   a low voltage power supply to output a negative voltage; and
   a low voltage switch operable to alternately connect and disconnect the low voltage supply to the plasma source.

6. The processing system of claim 3, the high voltage state defined by the plasma source having a potential of greater than 100 V positive with respect to the workpiece holder.

7. The processing system of claim 1, wherein the pulsed bias circuit comprises a low voltage circuit that includes a capacitor for discharging current from the plasma source when the bias voltage is switched to the low voltage state.

8. The processing system of claim 7, the low voltage state defined by the plasma source having a potential of between about 2 V and 100 V negative with respect to the workpiece holder.

9. The processing system of claim 1, further comprising a controller to direct the pulsed bias circuit to output a voltage pulse train comprising alternating portions of the high voltage state and low voltage state, the controller operable to vary a duty cycle of the voltage pulse train.

10. A method of treating a workpiece in a processing system, comprising:
    igniting a plasma using a plasma source;
    grounding a workpiece holder to receive ions from the plasma; and
    applying a voltage pulse train to the plasma source, the voltage pulse train comprising a high voltage portion in which the plasma source is biased positively with respect to ground and a low voltage portion in which the plasma source is biased negatively with respect to ground.

11. The method of claim 10, comprising directing ions through an extraction plate disposed between the plasma source and the workpiece holder, wherein the ions define an ion beam comprising ions incident over an angular range toward the workpiece holder.

12. The method of claim 10, comprising discharging current into the plasma source from a capacitor when the bias voltage is switched to a high voltage state.

13. The method of claim 10, comprising discharging current from the plasma source into a capacitor when the bias voltage is switched to a low voltage state.

14. The method of claim 10, comprising setting a plasma source potential in the high voltage state of greater than 100 V positive with respect to the workpiece holder.

15. The method of claim 10, comprising setting a plasma source potential in the low voltage state of between about 2 V and 100 V negative with respect to the workpiece holder.

16. The method of claim 10, further comprising:
    monitoring a charge at the workpiece after the voltage pulse train is applied to the plasma source; and
    setting a second voltage pulse train by changing one or more of a set voltage in the high voltage state, a set voltage in the low voltage state, a duration of the high voltage state, and a duration of the low voltage state in response to the charge.

17. An ion implantation system comprising:
    a plasma source;
    a movable workpiece holder coupled to ground to receive ions from a plasma supplied by the plasma source while moving the workpiece holder;
    an extraction plate disposed between the plasma source and the workpiece holder and arranged to direct ions over a range of angles toward the workpiece holder; and
    a pulse bias circuit operable to switch a bias voltage supplied to the plasma source and the workpiece holder between a high voltage state in which the plasma source is biased positively with respect to ground and a low voltage state in which the plasma source is biased negatively with respect to ground.

18. The ion implantation system of claim 17, wherein the pulsed bias circuit comprises:
    a high voltage circuit that includes a capacitor for discharging current into the plasma source when the bias voltage is switched to the high voltage state; and
    a low voltage circuit that includes a capacitor for discharging current from the plasma source when the bias voltage is switched to the low voltage state.

19. The ion implantation system of claim 18, the high voltage state defined by the plasma source having a potential of greater than 100 V positive with respect to ground, and the low voltage state defined by the plasma source having a potential of between about 2 V and 100 V negative with respect to ground.

* * * * *